(12) United States Patent
Hruska

(10) Patent No.: US 10,411,481 B2
(45) Date of Patent: Sep. 10, 2019

(54) DEVICE AND METHOD FOR GENERATING A HIGH VOLTAGE PULSE

(71) Applicant: Christopher Hruska, Blue Springs, MO (US)

(72) Inventor: Christopher Hruska, Blue Springs, MO (US)

(*) Notice: Subject to any disclaimer, the term of this patent is extended or adjusted under 35 U.S.C. 154(b) by 289 days.

(21) Appl. No.: 15/664,423

(22) Filed: Jul. 31, 2017

(65) Prior Publication Data

US 2019/0036346 A1 Jan. 31, 2019

(51) Int. Cl.
| | | |
|---|---|---|
| *H03K 3/00* | (2006.01) | |
| *H02J 5/00* | (2016.01) | |
| *H01F 27/24* | (2006.01) | |
| *H01F 27/28* | (2006.01) | |
| *H01F 27/02* | (2006.01) | |
| *H03K 3/57* | (2006.01) | |

(52) U.S. Cl.
CPC .............. *H02J 5/00* (2013.01); *H01F 27/022* (2013.01); *H01F 27/24* (2013.01); *H01F 27/28* (2013.01); *H03K 3/57* (2013.01)

(58) Field of Classification Search
CPC ....................................................... H03K 3/57
USPC ....................................................... 307/108
See application file for complete search history.

(56) References Cited

U.S. PATENT DOCUMENTS

| | | | | |
|---|---|---|---|---|
| 5,019,954 A | * | 5/1991 | Bourgeault | H02M 1/4258 363/21.12 |
| 2009/0046486 A1 | * | 2/2009 | Lu | H02M 3/285 363/45 |
| 2012/0119676 A1 | * | 5/2012 | Yao | H01F 38/42 315/297 |

* cited by examiner

*Primary Examiner* — Rexford N Barnie
*Assistant Examiner* — Dru Parries
(74) *Attorney, Agent, or Firm* — Hovey Williams LLP

(57) ABSTRACT

A hybrid pulse driver and method for generating a short, high-voltage pulse of electrical energy. The hybrid pulse driver combining a pulse transformer function and a flyback transformer function and comprising one or more core circuits, a switching circuit, and an output. Each core circuit including a transformer having a magnetic core, a single-turn primary winding, and a multi-turn secondary winding. The switching circuit, when switched to an on state, results in electrical energy discharging through the transformer in each core circuit, each transformer transforming the electrical energy into a stepped-up pulse, and each transformer transmitting a flyback pulse following the stepped-up pulse, the flyback pulse resetting the magnetic core. The output transmits an output pulse, the output pulse comprising the sum of each stepped-up pulse.

20 Claims, 14 Drawing Sheets

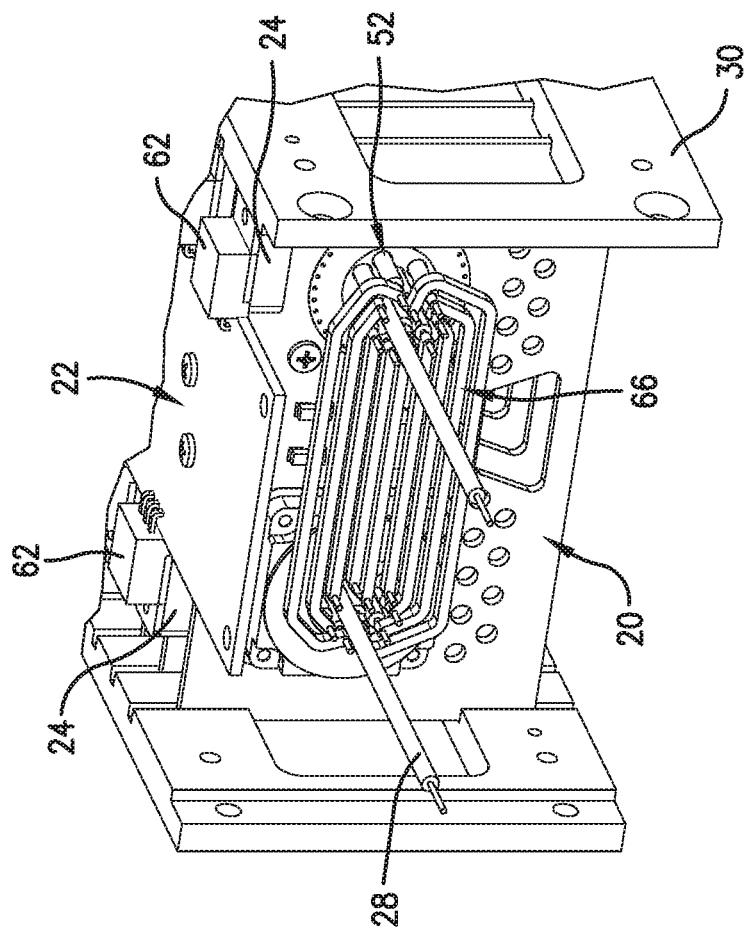
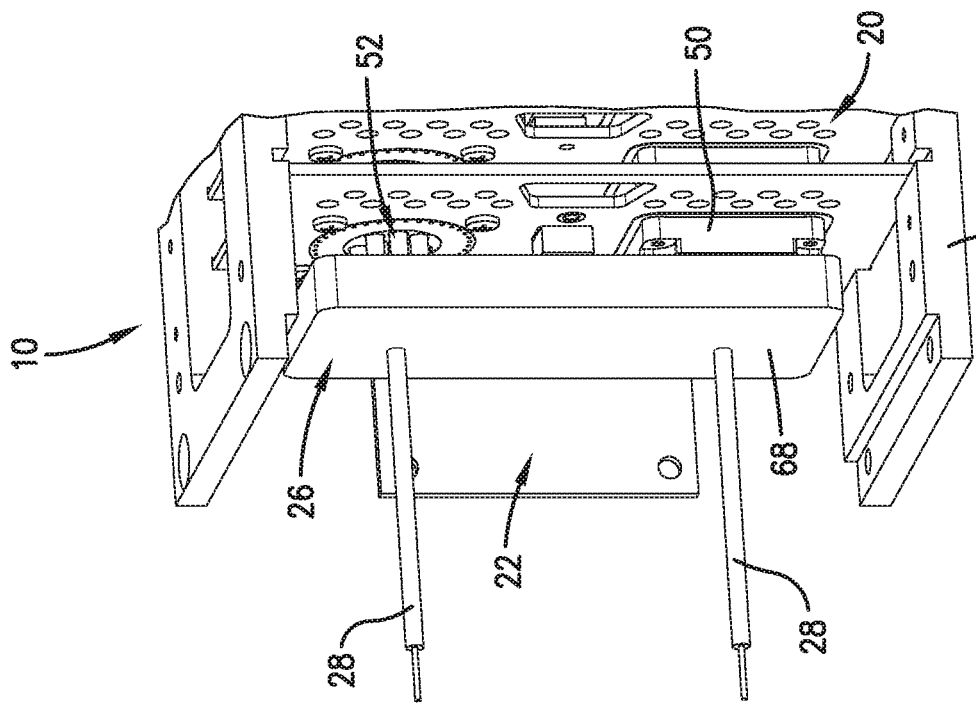
Fig. 9.
Fig. 8.

DEVICE AND METHOD FOR GENERATING A HIGH VOLTAGE PULSE

FIELD

The present invention relates to high-voltage, pulsed power supplies, and more particularly, embodiments concern a hybrid pulse driver combining a pulse transformer characteristic and a flyback transformer characteristic.

BACKGROUND

Several hardware and design options exist for providing high energy pulsed current, but many of these options are deficient. Many are generally evolved, in one form or another, from older flyback type electronic power supply topologies that employ more modern switching techniques and digital controls to transform energy from low voltage DC to high voltage pulsed AC. Others involve more modern systems that employ magnetic compression techniques or drift field diodes to create unipolar high voltage pulses. The need for high pulse repetition rates, short pulse widths, and more sophisticated electronic biasing of the powered devices has strained the capabilities of traditional high voltage wire wound transformers used in flyback type devices. The useful performance envelope for flyback systems has been extended from the millisecond into the micro-second pulse-width range by employing methods that rely on resonance or dynamic resonance to pump charge into a single "discharge event" using several shorter, faster pulses. This approach is effective in generating high voltage pulses in the micro-second pulse-width range at the expense of introducing some undesirable conditions for processes that seek to produce lower temperature ions with refined post-pulse ion treatment requirements. These enhancements also fall short in applications in which there is need to avoid the formation of micro channels in the plasma discharge which can lead to localized heating and damage to dielectrics as well as undesirable energy distributions for some non-thermal plasma processes. All these issues constrain the designs of plasma devices to materials that support good heat transfer, high dielectric strength and high thermal stability.

The issues identified above are greatly ameliorated by employing non-thermal plasma power supplies that deliver the energy in high voltage pulses that are in the nanosecond or tens of nanoseconds time range. This need for pulse widths in the nanosecond time range to drive next-generation devices at very precise levels of control is developing and so are the options for providing the very short, high energy pulses they require. More specifically, designs utilizing Blumlein pulse-forming lines or pulse-forming networks, Marx and vector inversion generators, drift-field diode devices, or magnetic compression generators are well documented and shown to be effective.

Each of these approaches has merit in some applications and deficiencies when applied to others. In the application to non-thermal high pressure plasmas, all present significant challenges involving, to one extent or another, cost and complexity, ability to tune to load variations, or undesirable situations for switching electronics. In practical non-thermal plasma applications, it is typically desirable to employ electronic power supplies capable of delivering high voltage pulses that have pulse widths in the sub-100 nanosecond time range to minimize the energy transfer to ions in the form of heat. Several technologies that provide pulses with peak voltage in the kilovolt range and pulse widths on the order of 1-10 nanoseconds have been disclosed previously.

Devices utilizing inductive adders or drift field diodes have been demonstrated, however existing designs tend to be relatively expensive and, at the same time, do not always provide a good solution for high-density ion generation application, as they are providing pulses that are unipolar, or may be shorter in duration than is required and are not configurable. Devices utilizing magnetic compression effects are effective in delivering the desired pulsed energy but are not amenable to applications which benefit from a broad bandwidth (frequency range) output.

Typical pulsed power supply devices in the inductive adder class seek to provide single polarity pulses with very little overshoot and very short pulse widths (1-10 nanoseconds) and do so by limiting both the primary and secondary turns to one. These supplies were targeted primarily at applications involving high energy physics such as lasers or ion accelerators. The turns ratio of 1:1 is employed to achieve the shortest possible pulse widths, but results in the need for either a larger number of cores or a higher primary side drive voltage, or both.

This background discussion is intended to provide information related to the present invention which is not necessarily prior art.

SUMMARY

Embodiments of the present invention solve the above-described and other problems and limitations by providing a hybrid pulse driver combining a pulse transformer characteristic and a flyback transformer characteristic.

In a first embodiment of the present invention, a hybrid pulse driver may be provided for combining a pulse transformer characteristic and a flyback transformer characteristic. The hybrid pulse driver may comprise a plurality of core circuits, a switching circuit, and an output. Each core circuit may include a transformer having a magnetic core, a single-turn primary winding, and a multi-turn secondary winding. The switching circuit, when switched to an on state, may result in electrical energy discharging through the transformer in each core circuit. Each transformer may transform the electrical energy into a stepped-up pulse and may transmit a flyback pulse following the stepped-up pulse. The flyback pulse may reset the magnetic core. The output may transmit an output pulse that includes a sum of each stepped-up pulse.

Another embodiment of the hybrid pulse driver includes the same elements as the driver described above and also includes each core circuit having a second transformer. The first and second transformers are hybrid transformers. Each core circuit may include a first surface opposing a second surface. The first hybrid transformer may be associated with the first surface and the second hybrid transformer may be associated with the second surface. The second hybrid transformer also includes a second magnetic core, a second single-turn primary winding, and a second multi-turn secondary winding. The switching circuit may trigger a first charge of electrical energy to be discharged through the first hybrid transformer and a second charge of electrical energy to be discharged through the second hybrid transformer. The first hybrid transformer may step up and transform the first charge into a first high voltage pulse, and the second hybrid transformer may step up and transform the second charge into a second high voltage pulse. The output may receive an output pulse from the first and second hybrid transformers, and the output pulse may a sum of the first and second high voltage pulses of each core circuit. The output pulse may be followed by a flyback pulse that resets the first and second magnetic cores of each core circuit, and the flyback pulse may result from the multi-turn secondary winding.

In yet another embodiment of the present invention, a method may be provided for providing a pulse transformer characteristic with a flyback transformer characteristic. The method may broadly comprise the following steps. A capacitor may be charged and result in electrical energy being stored in the capacitor. Each capacitor may be associated with one of a plurality of core circuits. Each core circuit may further include a transformer having a single-turn primary winding, a magnetic core, and a multi-turn secondary winding. The stored electrical energy may be discharged through the transformer. The transformer may step up and transform the electrical energy into a stepped-up pulse of electrical energy. The stepped-up pulse of electrical energy from each of the plurality of core circuits may be combined. The combined stepped-up pulse of electrical energy may be outputted. A flyback pulse, resulting from the multi-turn secondary winding, may reset the magnetic core in each transformer.

This summary is not intended to identify essential features of the present invention, and is not intended to be used to limit the scope of the claims. These and other aspects of the present invention are described below in greater detail.

DRAWINGS

Embodiments of the present invention are described in detail below with reference to the attached drawing figures, wherein:

FIG. 8 is a fragmentary isometric view of the hybrid pulse driver configured to output a unipolar pulse with selectively removable end caps connecting the secondary windings in series;

FIG. 9 is a fragmentary isometric view of the hybrid pulse driver of FIG. 8 with the end cap cutaway to show the lead connectors connections with the secondary windings;

The figures are not intended to limit the present invention to the specific embodiments they depict. The drawings are not necessarily to scale.

DETAILED DESCRIPTION

The following detailed description of embodiments of the invention references the accompanying figures. The embodiments are intended to describe aspects of the invention in sufficient detail to enable those with ordinary skill in the art to practice the invention. Other embodiments may be utilized and changes may be made without departing from the scope of the claims. The following description is, therefore, not limiting. The scope of the present invention is defined only by the appended claims, along with the full scope of equivalents to which such claims are entitled.

In this description, references to "one embodiment", "an embodiment", or "embodiments" mean that the feature or features referred to are included in at least one embodiment of the invention. Separate references to "one embodiment", "an embodiment", or "embodiments" in this description do not necessarily refer to the same embodiment and are not mutually exclusive unless so stated. Specifically, a feature, structure, act, etc. described in one embodiment may also be included in other embodiments, but is not necessarily included. Thus, particular implementations of the present invention can include a variety of combinations and/or integrations of the embodiments described herein.

Broadly characterized, the present invention relates to high-voltage, pulsed power supplies. More particularly, embodiments provide a hybrid pulse driver combining a pulse transformer characteristic and a flyback transformer characteristic in order to generate a high voltage pulse. The hybrid pulse driver may provide very short (nanosecond) high energy (kilovolt) pulses and may include the ability to manipulate those pulses. The hybrid pulse driver may be configured to generate a plurality of pulses with very little time offset such that when the pulses add together the result is a pulse producing thousands of volts with an offset in timing of less than a few nanoseconds. These short, high energy pulses may be used for a variety of applications, e.g. high density ion generation processes.

Figure 1:
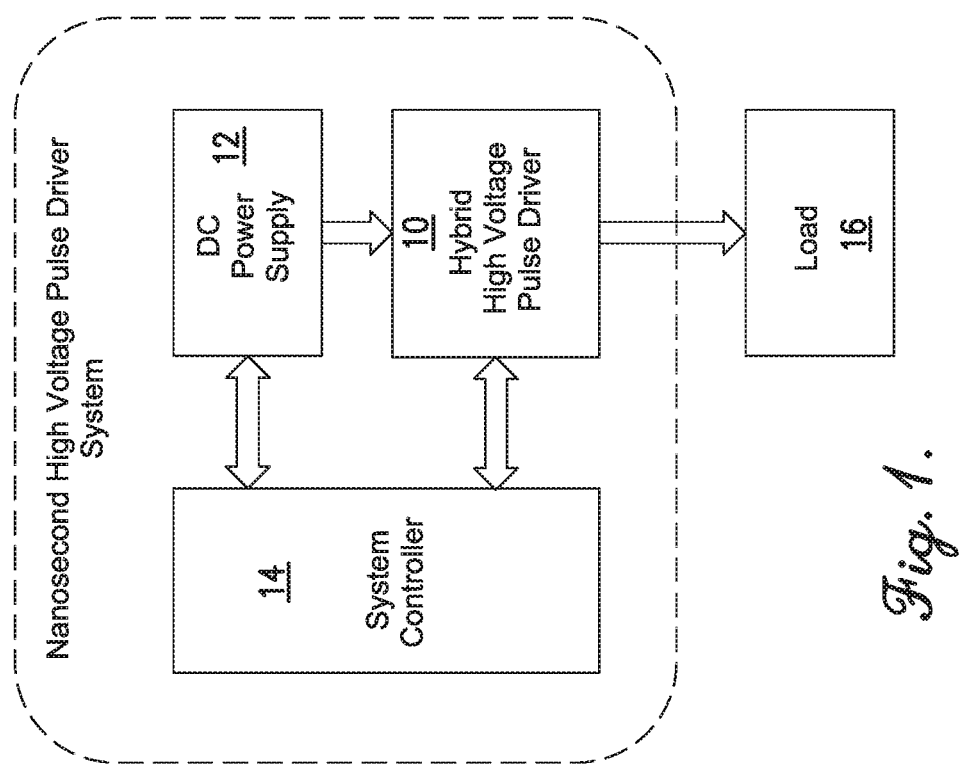
FIG. 1 is a high-level block diagram of an embodiment of a hybrid pulse driver in an exemplary operating environment.

Referring to FIG. 1, the hybrid pulse driver 10 is shown in an exemplary operating environment. The hybrid pulse driver may be connected to and in electrical communication with a direct current ("DC") power supply 12, a controller 14, and a load 16. The power supply 12 and controller 14 may be external components, or they may be integrated with the hybrid pulse driver 10. The power supply 12 may provide power to the hybrid pulse driver 10, which may be used to charge capacitors in a core circuit. The controller 14 may control the hybrid pulse driver 10 by sending an input signal to the hybrid pulse driver 10 causing it to generate a pulse or plurality of pulses. The load 16 may be electrically connected to the output of the hybrid pulse driver 10. As discussed, the short, high energy pulse may be used for loads such as high density ion generation processes.

Figure 2:
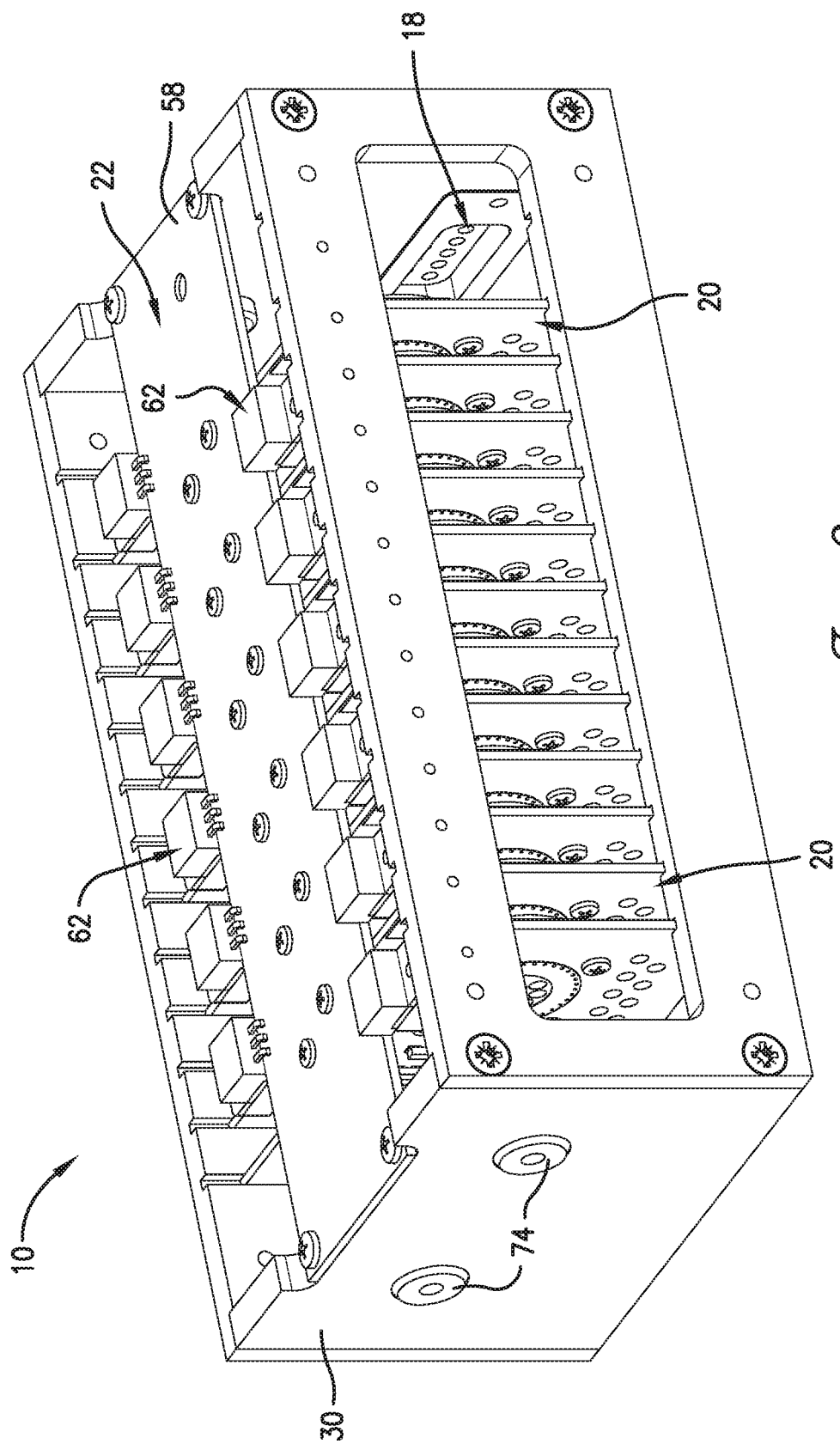
FIG. 2 is an upper isometric view of the hybrid pulse driver without secondary windings or end caps.

Referring to FIG. 2, an embodiment of the hybrid pulse 10 driver is shown. The hybrid pulse driver 10 may broadly comprise an input 18, one or more core circuits 20, a switching circuit 22, one or more connectors 24 (see FIGS.

4, 9, and 12), one or more end caps 26 (see FIGS. 8 and 11), an output 28 (see FIGS. 8-14), and a housing 30. For example, the hybrid pulse driver 10 may comprise the input 18, twelve core circuits 20 modularly stacked, eleven secondary winding conductors fed through eleven winding supports, one switching circuit 22, twelve connectors 24 (one for each core circuit), two end caps, the output 28, and the housing 30.

Figure 3:
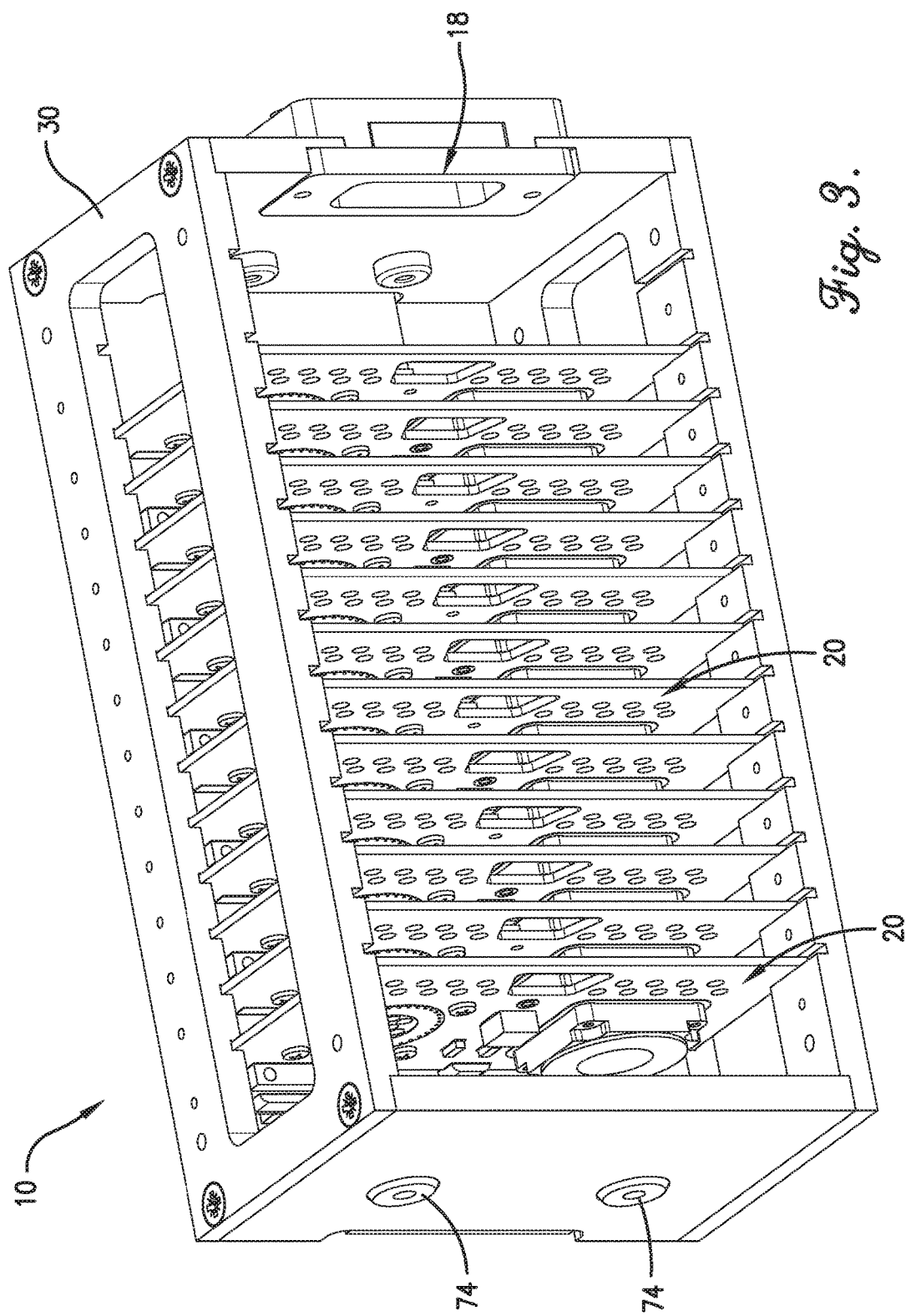
FIG. 3 is a lower isometric view of the hybrid pulse driver without secondary windings or end caps.

Referring to FIG. 3, the input 18 may receive power from the external or integrated DC power supply 12. For example, the input 18 may receive 100-150V from the power supply 12. The input 18 may provide power to a DC charging circuit on each core circuit 20, and each charging circuit may transmit the power to charge capacitors associated with the charging circuit. The input 18, or a separate high voltage, low current power supply, may also be used to bias an output pulse, as described in more detail below.

Figure 4:
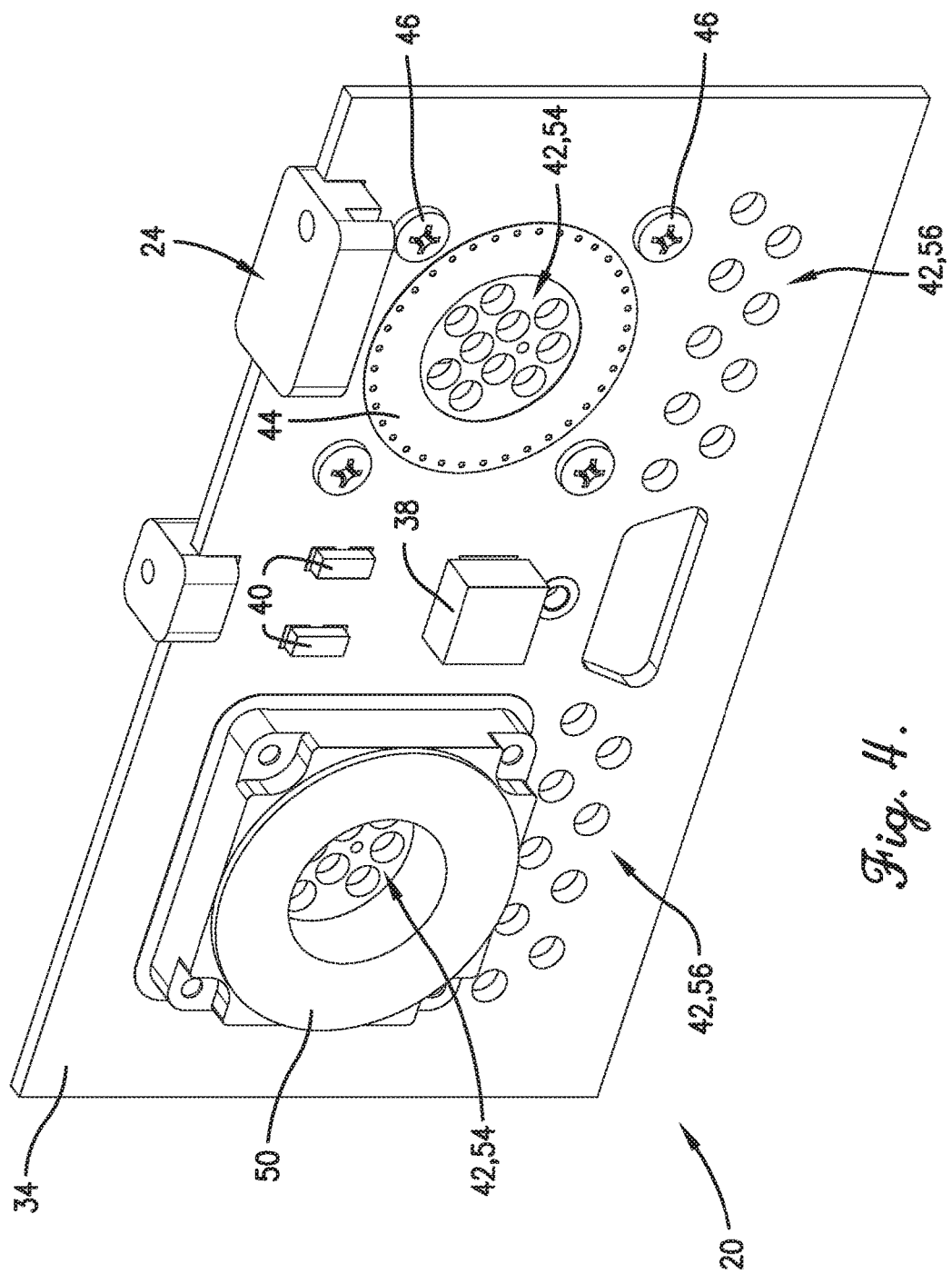
FIG. 4 is a isometric view of a core circuit of the hybrid pulse driver.
Figure 5:
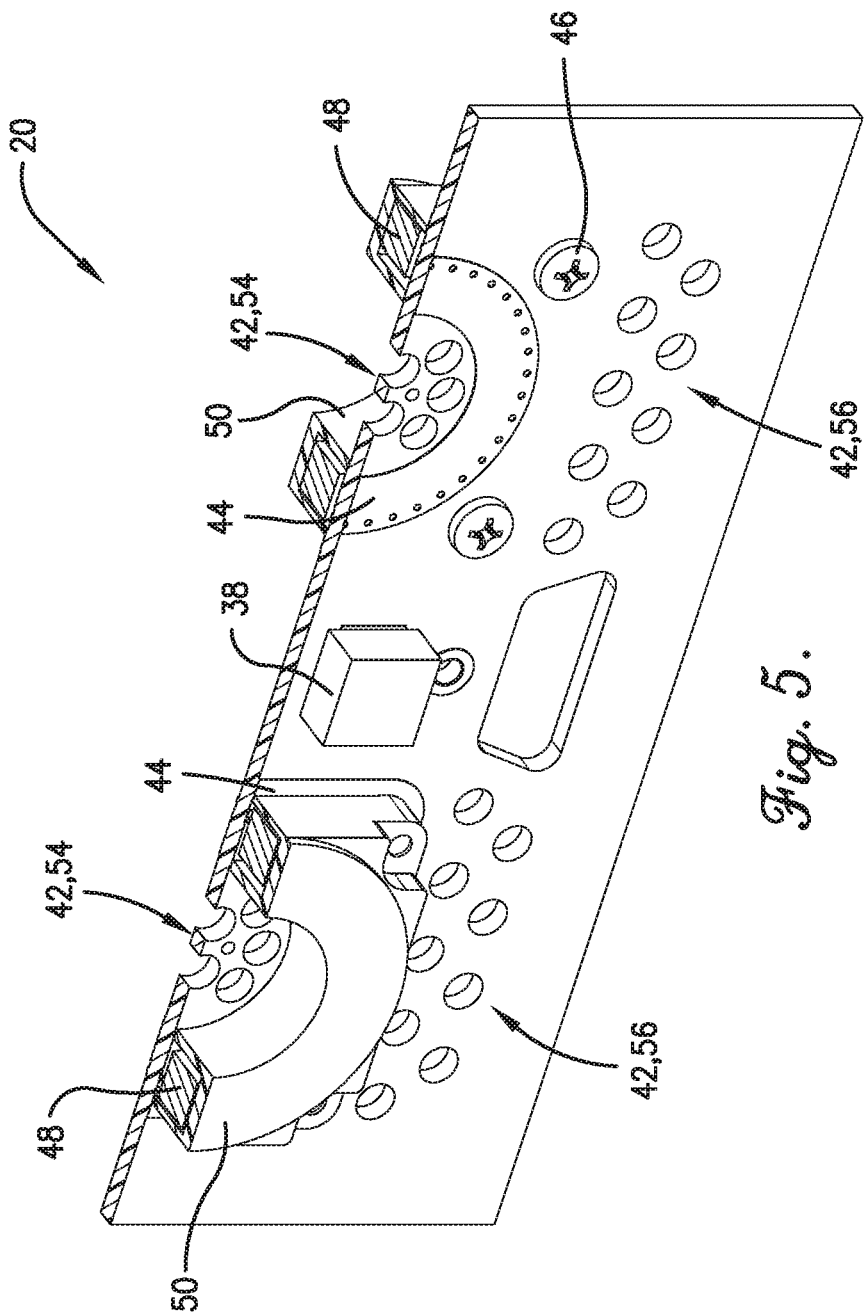
FIG. 5 is a cross-sectional isometric view of the core circuit.
Figure 6:
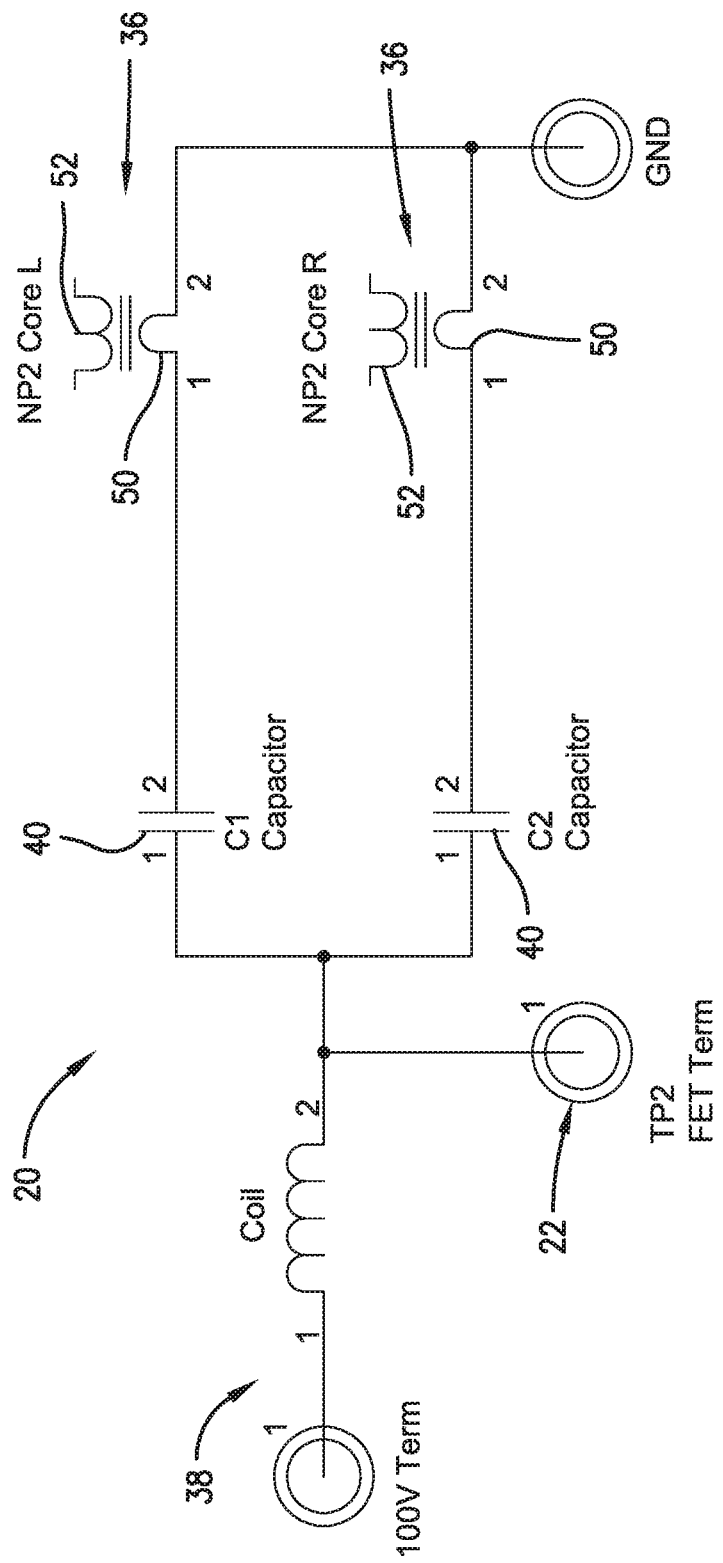
FIG. 6 is a schematic of the core circuit of FIG. 5.

Referring to FIGS. 4-6, the core circuits 20 may each broadly include a core circuit board 34, one or more transformers 36, a charging circuit 38, one or more capacitors 40, and one or more winding supports 42. For example, each core circuit 20 may include two transformers 36 on opposing sides of the core circuit 20 and/or circuit board 34, one charging circuit 38, and two capacitors 40, and twenty-two winding supports 42 (eleven inboard and eleven outboard of the magnetic core). Generally, the core circuit 20 may be electrically connected to the switching circuit 22, the output 28, and the direct current power supply 12. The core circuit 20 may be configured to output a high voltage pulse when triggered by the switching circuit 22. A plurality of core circuits 20 may be modularly stacked together such that each core circuit 20 contributes a high voltage pulse to the output 28. The high voltage pulse outputted by the core circuits 20 may be the sum of each core circuit 20 contribution.

The circuit board 34 may be a printed circuit board, and it may include one or more winding supports 42, one or more conductive traces, one or more core housing conductive pads 44, one or more conductive fasteners 46, and various common electrical components. The core housing conductive pads 44 may be associated with each transformer 36 and may be shaped similar to the magnetic core and/or core housing, e.g. annular, quadrangular, and the like. The core housing conductive pad 44 may include feedthroughs passing through the circuit board 34 to connect with a core housing (primary winding 50 described below). The conductive pads 44 may be concentrically aligned and positioned on opposing sides of the circuit board 34, and feedthroughs may connect the opposing conductive pads. One of the opposing conductive pads 44 may be grounded, e.g., the conductive pad 44 on the same side as the core housing may be grounded. The conductive pads 44 may connect with the core housing such that together the pad 44 and core housing encapsulate a magnetic core. Conductive fasteners 46 may be inserted through an aperture in the circuit board 34 and may fasten to the core housing. For example, a screw may be inserted through the circuit board 34 and screwed into the core housing.

The transformers 36 may each include a magnetic core 48, a primary winding 50, and a secondary winding 52. The transformer 36 may be used to step-up the voltage from the primary winding 50 to the secondary winding 52. Additionally, the transformer 36 may be a hybrid transformer that combines the functionality of a pulse transformer and a flyback transformer. The pulse transformer aspect may provide a pulse with a short pulse width, fast rise time, and/or fast fall time. It may also provide a low coupling capacitance between the primary winding 50 and secondary winding 52 in order to protect the circuitry on the primary side from high-powered transients created by the load 16. In addition to providing high voltage isolation, the low coupling capacitance feature is provided in order to minimize the parasitic inter-winding capacitance, both between the primary 50 and secondary windings 52 and between individual secondary winding wires. These parasitic inter-winding capacitances may have detrimental effects on the pulse waveform (e.g. slows down and spreads out the waveform) and may represent loss of efficiency in the operation of the driver 10. These types of parasitic losses become significant as the pulse repetition rate increases and can severely impact the performance of the driver 10. The flyback transformer aspect may provide a flyback signal that occurs after the initial output pulse generated by the hybrid pulse driver. This flyback signal may be used to reset the magnetic domains in the magnetic core 48 since a pulse transformer has a duty cycle of less than 0.5. The inductance of the multi-turn secondary winding 52 may cause the flyback pulse. This flyback pulse may pull the domains of the magnetic core 48 in the opposite direction to return the domains to their pre-pulse firing condition. The flyback pulse has an amplitude about less than half of the peak voltage for the initial output pulse. Moreover, the flyback pulse may be slower than the output pulse, but it is on the same order of time (e.g., on the order of nanoseconds) as the output pulse, so it is gone before the next output pulse. The magnitude of the flyback pulse can be controlled by insertion of appropriate bypass diodes in the core circuit 20. Typically, the flyback is problematic in most applications, so engineers may design circuits to reduce or eliminate it. However, the hybrid pulse driver 10 keeps the flyback pulse and uses it to reset the magnetic core 48, which would otherwise need to be reset using additional and/or external components. If the magnetic core 48 was not reset, then the performance of the transformer 36 would be degraded.

The magnetic core 48 may have an annular shape or quadrangular shape, and it may be made of any suitable material, such as nano-crystalline. In some embodiments, the magnetic core 48 is an annular, tape-wound, nano-crystalline magnetic core 48. The core 48 may also be made in a variety of sizes, e.g. the cross-section area of the core may be about 0.1 to 0.5 square centimeters. If the magnetic core 48 has a cross-sectional area between 0.1 to 0.5 square centimeters and the capacitors 40 are sized to appropriately limit the peak current when switched on, then the design can be made such that core 48 will not saturate under normal operating conditions. The core 48 may also comprise a square shoulder flux curve so that the core's magnetic domains will quickly switch direction, thereby providing as short of a pulse width as possible, with extremely high rates of dV/dT (e.g. 100 gigavolts per second (GV/s) to 200 GV/s) at the output 28 of the hybrid pulse driver 10. Another advantage of the tape-wound, nano-crystalline core 48 is that eddy currents in the core 48 itself are reduced or suppressed due to the thin layers of tightly wound nano-crystalline tape.

The primary winding 50 may comprise any number of turns, but in some embodiments, the primary winding 50 comprises only a single turn. Furthermore, the primary winding 50 may be or may include a conductive core housing that partially or fully encapsulates the magnetic core 48 in conjunction with the core housing conductive pad 44 on the circuit board 34. The core housing may be an integral anodized aluminum core housing and may function as the primary winding 50 for the transformer 36. By using the core housing as the primary winding 50, the core circuit 20 is much more compact and allows the core circuits 20 to be modularly stacked. Furthermore, because the core housing is the primary winding 50, the current flowing through the primary winding 50 completely encapsulates the magnetic core 48 so there is no magnetic flux leakage during operation which improves the efficiency of the transformer 36 and effectively suppresses radiated electromagnetic energy (low radio frequency interference (RFI)).

The secondary winding 52 may include or have one or more turns, but in some embodiments, the secondary winding 52 comprises a plurality of turns. The multi-turn secondary winding 52 steps up the voltage from the primary winding 50 to the secondary winding 52, and the multiple turns in the secondary winding 52 also cause the flyback that resets the magnetic core 48. The secondary winding 52 may be a wire that is fed through the winding supports inboard of each magnetic core 48, and if the secondary windings 52 are connected in parallel, then the secondary winding wire may be fed through the winding supports outboard of the magnetic core 48 and/or positioned at the bottom of the core circuit 20. In some embodiments, the secondary winding wires may be physically parallel wires fed through the winding supports inboard of the magnetic core 48, and each end of the wire may have an exposed conductive lead for connecting to one of the end caps discussed in more detail below. Likewise, if the secondary windings 52 are connected in parallel, then the secondary winding wire may be fed through the winding supports outboard of the magnetic core 48 and may also be physically parallel wires with exposed conductive leads for connecting to one of the end caps. It will be appreciated that the secondary windings 52 may be connected in the various configurations described above (e.g., series and parallel) without end caps 26.

The charging circuit 38 may be a direct current charging circuit configured for approximately between 50 and 150V, and it may receive power from the direct current power supply 12. The charging circuit 38 may include a power coil to limit surge current. The charging circuit 38 may be configured to charge the one or more capacitors 40. For example, each charging circuit 38 may charge two capacitors 40 on each core circuit 20. The charge stored by each capacitor 40 may depend on the size of the capacitor 40. For example, the size of the capacitor 40 may be about 6.8 nF to 100 nF. The capacitor 40, when triggered by the switching circuit 22, may discharge its stored energy through the associated transformer 36.

The winding support 42 may be an aperture in the circuit board 34 for receiving a wire, winding, or conductor, e.g. the secondary winding. A first set of winding supports 54 may be positioned inboard of each core housing conductive pad 44, and a second set of winding supports 56 may be positioned outboard of the core housing conductive pad 44 and/or near the bottom of the circuit board 34 as shown in FIG. 4 among others. As used herein, the term "inboard" means located inside and towards the center, and the term "outboard" means located outside. The "inboard" and "outboard" terms should be construed consistently with location of the winding supports depicted in FIG. 4. The second set 56 may be provided as an attachment to the circuit board 34, or the second set 56 may be integrated with the circuit board 34. The winding supports 42 may facilitate uniform spacing between the secondary winding 52 wires in order to keep the interwire capacitance and inductance low. Each of the first set of winding supports 54 may be spaced approximately one-quarter inch apart from one another and the tolerance may be about ten thousandths of an inch. Likewise, each of the second set of winding supports 56 may be spaced approximately one-quarter inch apart from one another and the tolerance may be about ten thousandths of an inch.

Figure 7:
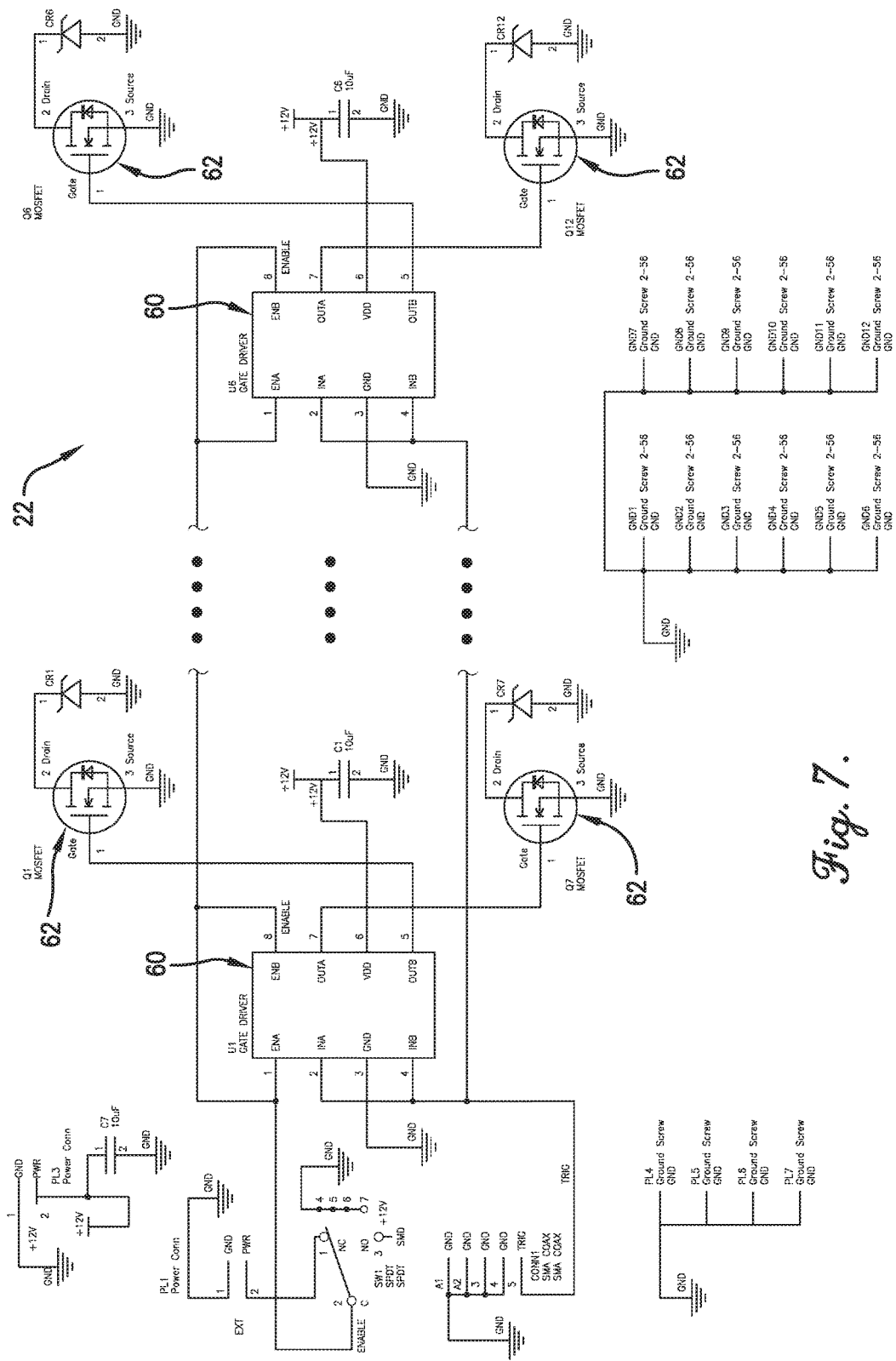
FIG. 7 is a schematic of a switching circuit of the hybrid pulse driver.

Referring to FIGS. 2 and 7, the switching circuit 22 may comprise a switching circuit board 58, one or more gate drivers 60, and one or more switches 62. The circuit board 58 may be a printed circuit board. The gate driver 60 may receive a low-power input from the controller 14 and generate a high-current drive input for a gate of the switch 62. The switch 62 may be a transistor, e.g. a FET, IGFET, MOSFET, and the like. For example, the switch 62 may be a 250V MOSFET switching at ten nanoseconds. Each gate driver 60 is capable of driving two switches 62, and each switch 62 may be associated with a different core circuit 20. For example, if the hybrid pulse driver 10 comprises twelve core circuits 20 with two capacitors 40 per core circuit 20, then the switching circuit 22 may comprise six gate drivers 60 driving twelve switches 62, each switch 62 associated with a different core circuit 20. When the gate is driven to put the switch 62 in an on state, then the switch 62 may trigger the associated capacitors 40 to discharge. Using the previous example, each switch 62 triggered to the on state will result in the two capacitors 40 on the associated core circuit 20 discharging.

Referring again to FIG. 2, the connectors 24 may attach to the core circuit board 34 and the switching circuit board 58 and provide an electrical connection between. For example, the connector 24 may provide an electrical connection between one of the switches 62 and its associated core circuit 20 and capacitors 40. The connector 24 may also include a heat sink that absorbs heat from the switch 62 in order to prevent the switch 62 from overheating and becoming damaged. The connector 24 may be attached to each core circuit 20, so if there are twelve core circuits 20 then there may be twelve connectors 24 attaching each core circuit 20 to the switching circuit 22. Likewise, each connector 24 may include the heat sink, and the heat sink may be provided for each switch 62. So if there are twelve switches 62 for the twelve core circuits 20, then there may be twelve heat sinks, one heat sink for each switch 62.

Figure 10:
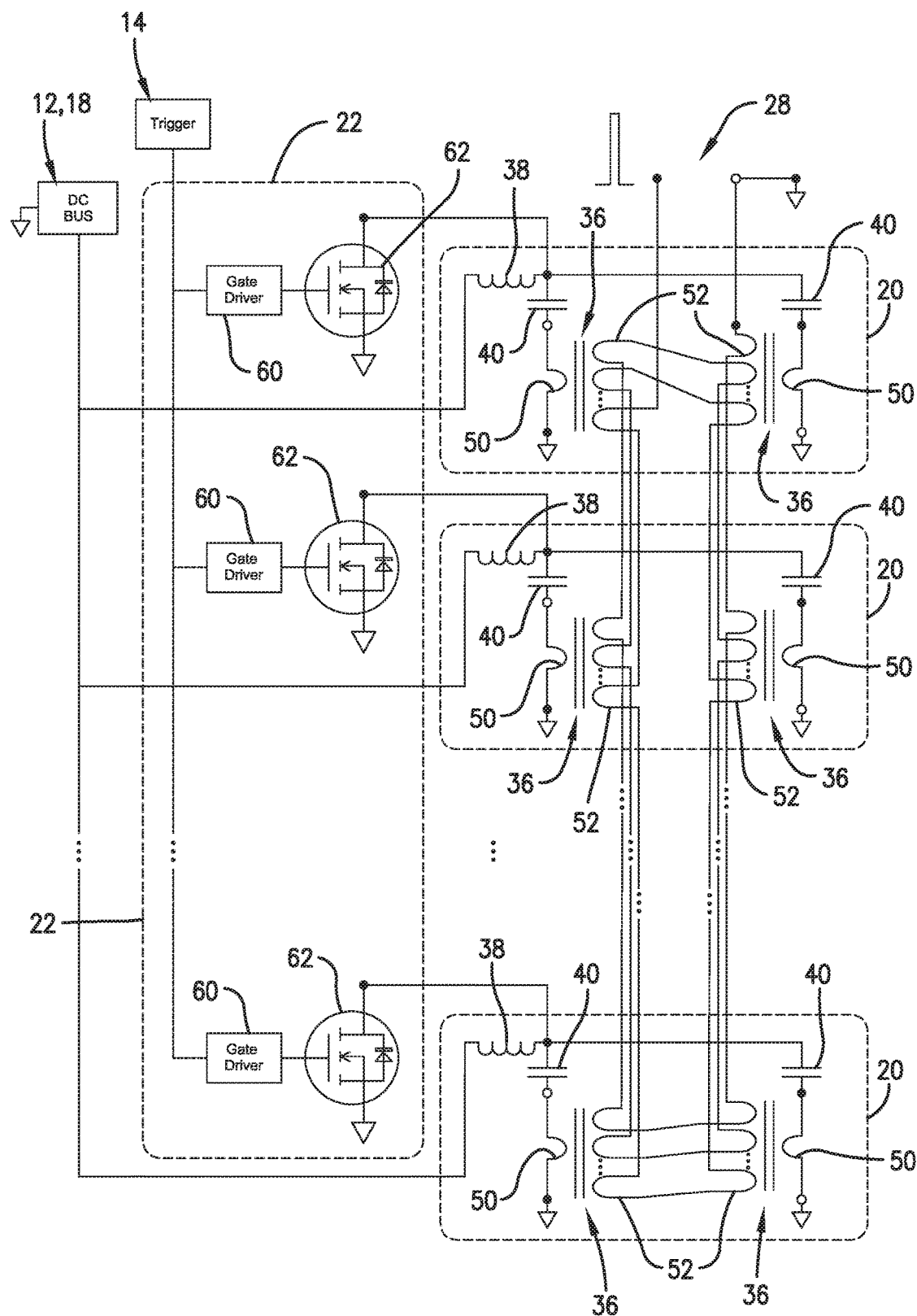
FIG. 10 is a schematic of the hybrid pulse driver configured to output a unipolar pulse with selectively removable end caps connecting the secondary windings in series.
Figure 12:
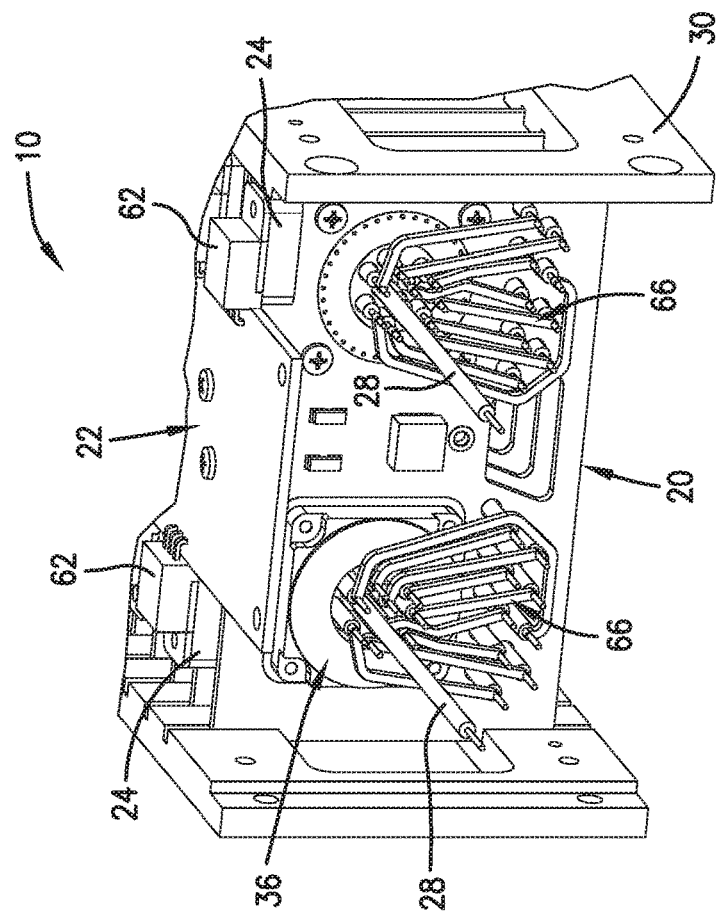
FIG. 12 is a fragmentary isometric view of the hybrid pulse driver of FIG. 11 with the end cap cutaway to show the lead connectors connections with the secondary windings.
Figure 11:
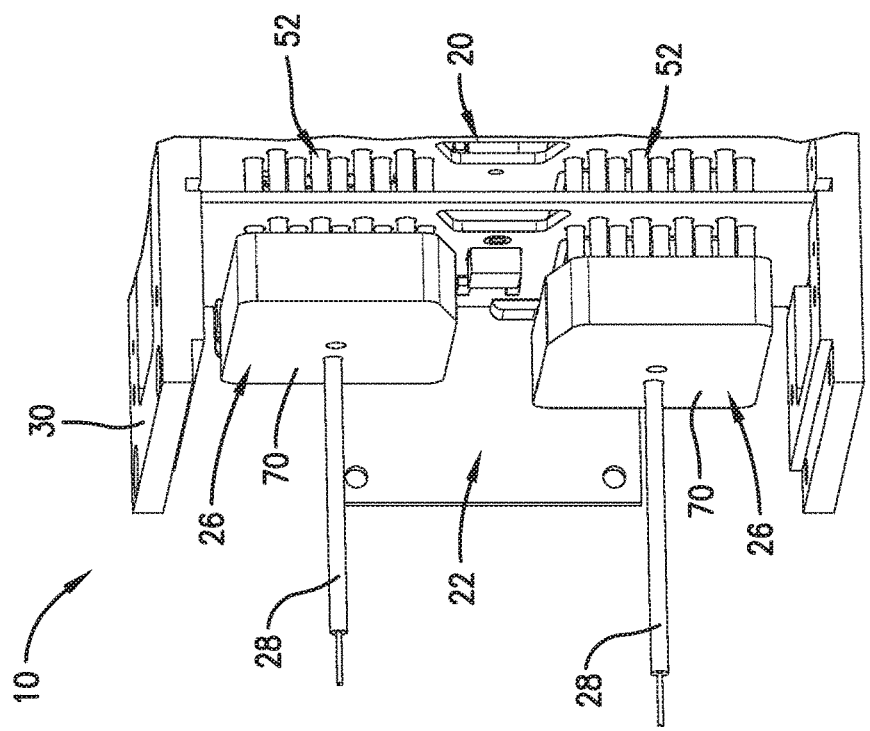
FIG. 11 is a fragmentary isometric view of the hybrid pulse driver configured to output a bipolar pulse with selectively removable end caps connecting the secondary windings in parallel.
Figure 13:
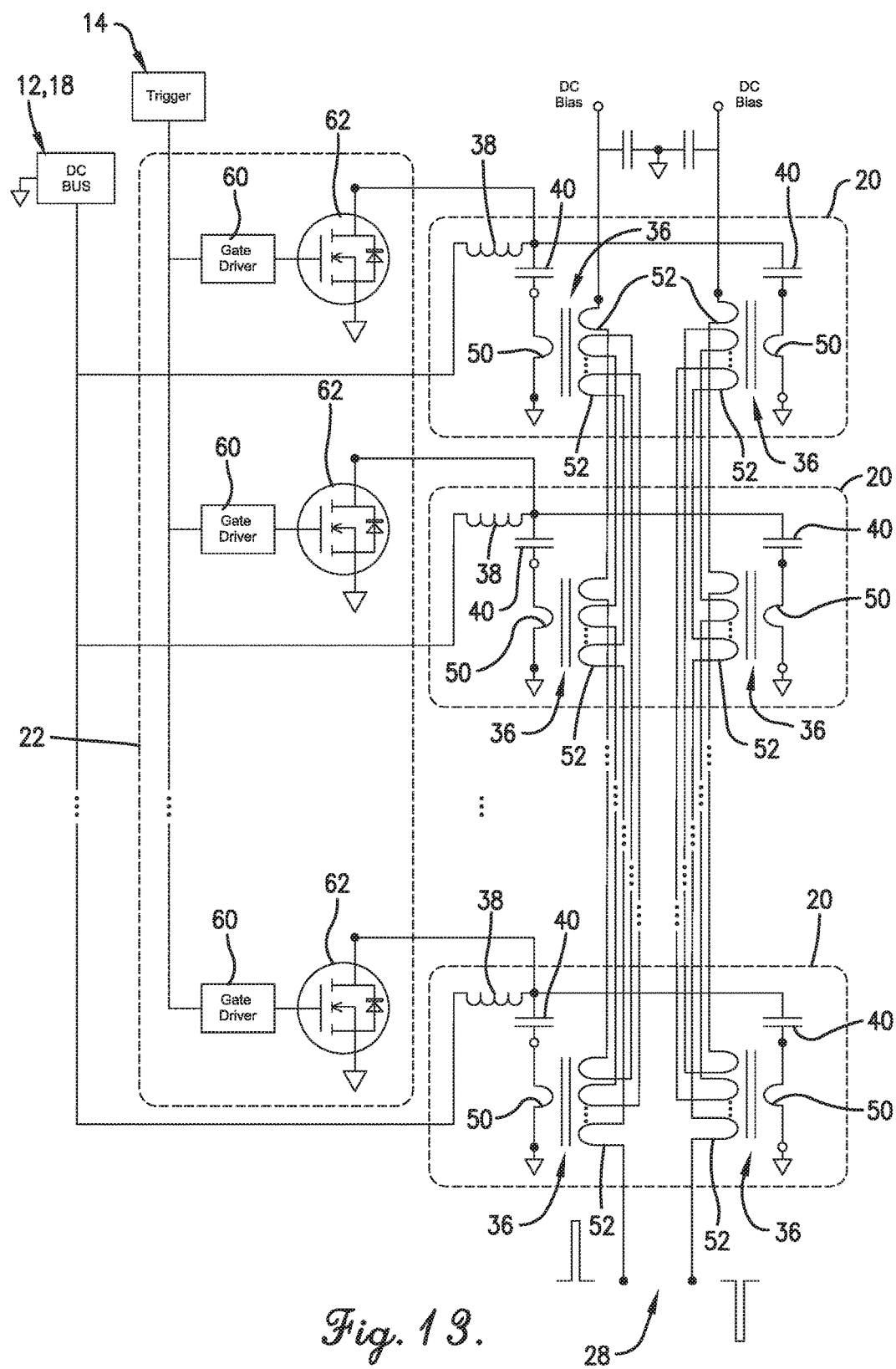
FIG. 13 is a schematic of the hybrid pulse driver configured to output a bipolar pulse with selectively removable end caps connecting the secondary windings in parallel.
Figure 14:
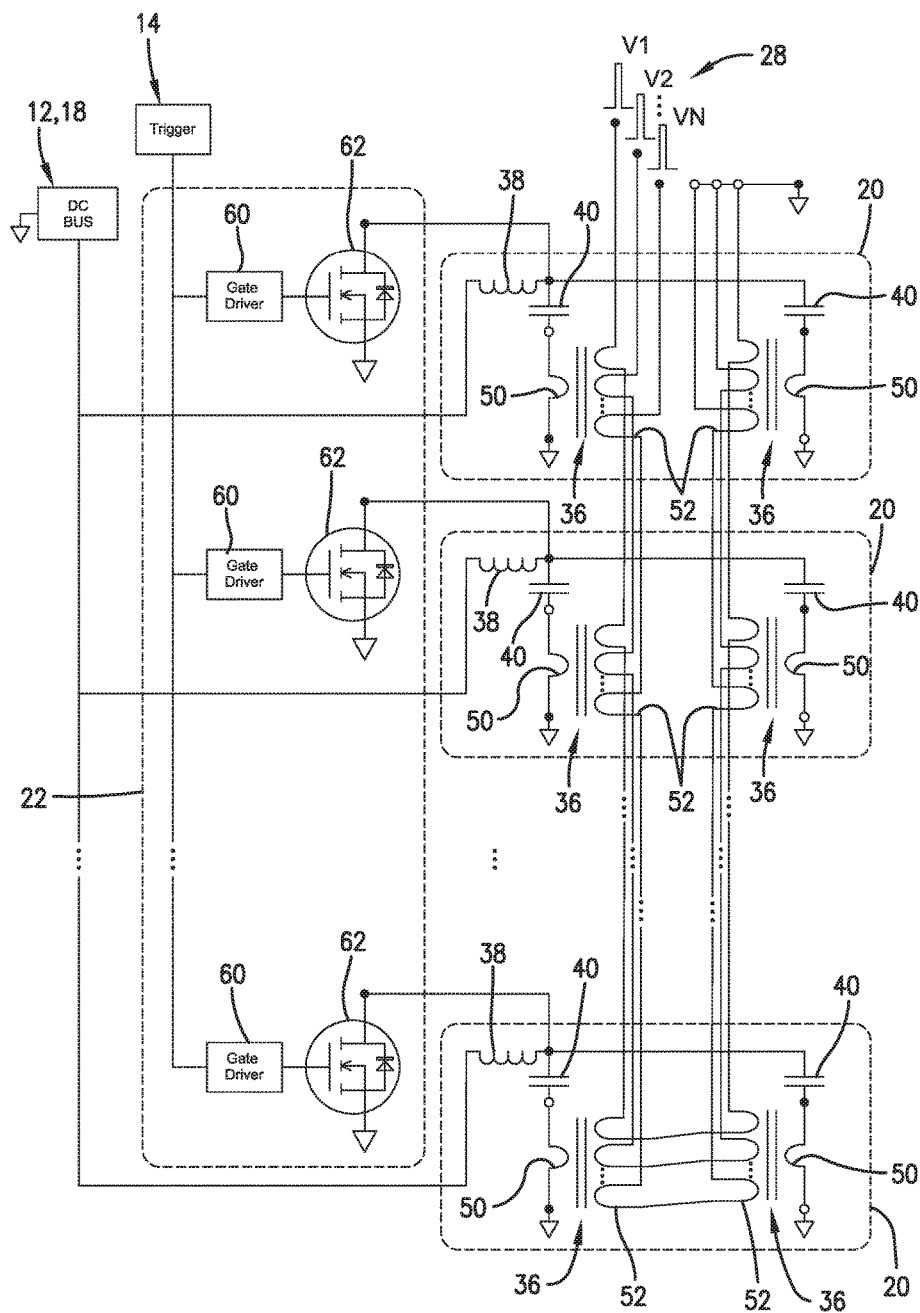
FIG. 14 is a schematic of the hybrid pulse driver with selectively removable end caps configuring the hybrid pulse driver to output a plurality of pulses.

Referring to FIGS. 8 and 11, the end cap 26 may be selectively removable and configured to connect the leads of the secondary windings 52. Each end cap 26 may comprise one or more lead connectors 66. The lead connectors 66 may be conductive prongs configured for attaching and/or connecting the secondary winding 52 wires. Referring to FIGS. 8-10, a first selectively removable end cap 68 may connect the secondary windings 52 of each core circuit in series resulting in the output pulse having a unipolar voltage. The lead connectors 66 in the first end cap 68 may connect secondary winding 52 wires fed through both sets of the first set of winding supports 54, as shown. In contrast to typical multi-turn secondary windings in which all the secondary turns on each secondary winding are made in sequence before proceeding to the next winding, FIG. 10 illustrates an embodiment in which one secondary winding turn is made for each transformer before making the second turn on each transformer and so on. Configuring the secondary winding in this manner results in a very compact output pulse and compact pulse from each core circuit because delays from separate secondary windings would delay rather than add together as desired for the output pulse. Referring to FIGS. 11-13, a second selectively removable end cap 70 may connect the secondary windings 52 of each core circuit 20 in parallel resulting in the output pulse having a bipolar voltage. The lead connectors 66 in the second end cap 70 may connect secondary winding 52 wires fed through the first set of winding supports 54 with the secondary winding 52 wires fed through the second set of winding supports 56. Referring to FIG. 14, a third selectively removable end cap 72 may connect the secondary windings 52 of each core circuit 20 such that the output and/or output pulse includes a plurality of pulses for driving multiple loads 16. For example, each stepped-up pulse may combine with one of the plurality of output pulses and may simultaneously drive a separate load. The schematic in FIG. 14 illustrates an embodiment where each of the stepped-up pulses is associated with one turn of the secondary winding rather than one of the transformers. Thus, the stepped-up pulses associated with a first turn on each secondary winding can be combined or added together in a first output pulse, and the stepped-up pulses associated with a second turn on each secondary winding can be combined or added together in a second output pulse, and so on. Therefore, the plurality of pulses may include a first output pulse and a second output pulse, each pulse driving a separate load.

Referring again to FIGS. 8-14, the output 28 may be electrically connected to each of the secondary windings 52 and may transmit the output pulse, which may be the sum of each stepped-up pulse in a single high voltage pulse, or the output and/or output pulse may comprise a plurality of pulse when as described above when the hybrid pulse driver is configured with the third end cap 72. The output pulse may be approximately 20 kV.

The housing 30 may be generally shaped like a rectangular cuboid and may include slots for receiving the core circuits 20. The housing 30 may also include high voltage lead exit bushings 74 that provide insulation between the output leads and the grounded housing in order to control the shape and strength of the electric field generated by the output pulse. The switching circuit 22 may attach across the top of the housing 30 as shown in FIG. 2. The switching circuit 22 may be positioned transverse to the core circuits 20 such that the switching circuit 22 extends across each core circuit 20. The switching circuit 22 may be fastened across the top of the housing 30 and, as previously discussed, the connectors 24 may mechanically and electrically connect the switching circuit 22 to each of the core circuits 20. Furthermore, the housing 30 may be made of aluminum, aluminum alloys, cast aluminum alloy or other suitable commonly available rigid material.

In some embodiments, the hybrid pulse driver 10 may comprise a plurality of core circuits 20 modularly stacked. The core circuits 20 may be stacked parallel to one another such that each winding support 42 is aligned. It will be appreciated that the core circuits 20 may be stacked in any manner, e.g. horizontally, vertically, circumferentially, and the like. Furthermore, a single switching circuit 22 may connect to each of the core circuits 20. In some embodiments, the plurality of core circuits 20 drive a single secondary winding 52. For example, the plurality of core circuits 20 may share the same secondary winding 52, but each core circuit 20 has one or two primary windings 52, each adding a pulse of energy to the same secondary winding 52 in the same time frame. This enables the voltage to add in the output pulse without the inductance of the secondary windings 52 adding. In other embodiments, the core circuits 20 may drive multiple secondary windings 52. Each core circuit 20 may be configured to provide a high energy pulse to the secondary winding 52 and output 28. The voltage of the output pulse increases with each core circuit pulse added to the output pulse. Thus, the modular design of the hybrid pulse driver 10 allows any number of core circuits 20 to be stacked together to achieve a desired high energy pulse.

Figure 15:
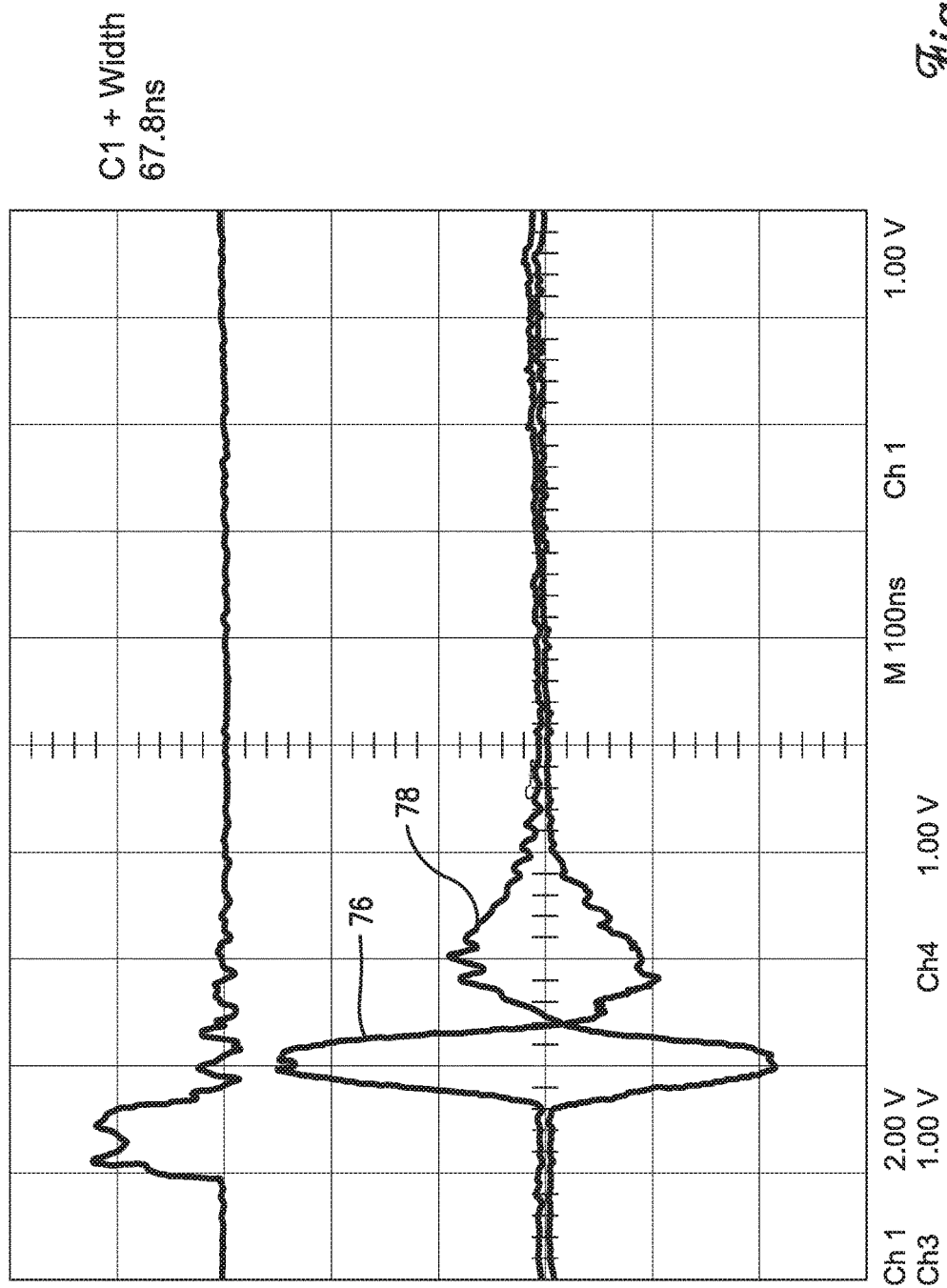
FIG. 15 is a time-voltage graph illustrating a gate signal and a high voltage output waveform for the hybrid pulsed driver of FIG. 10 configured for outputting a bipolar pulse.
Figure 16:
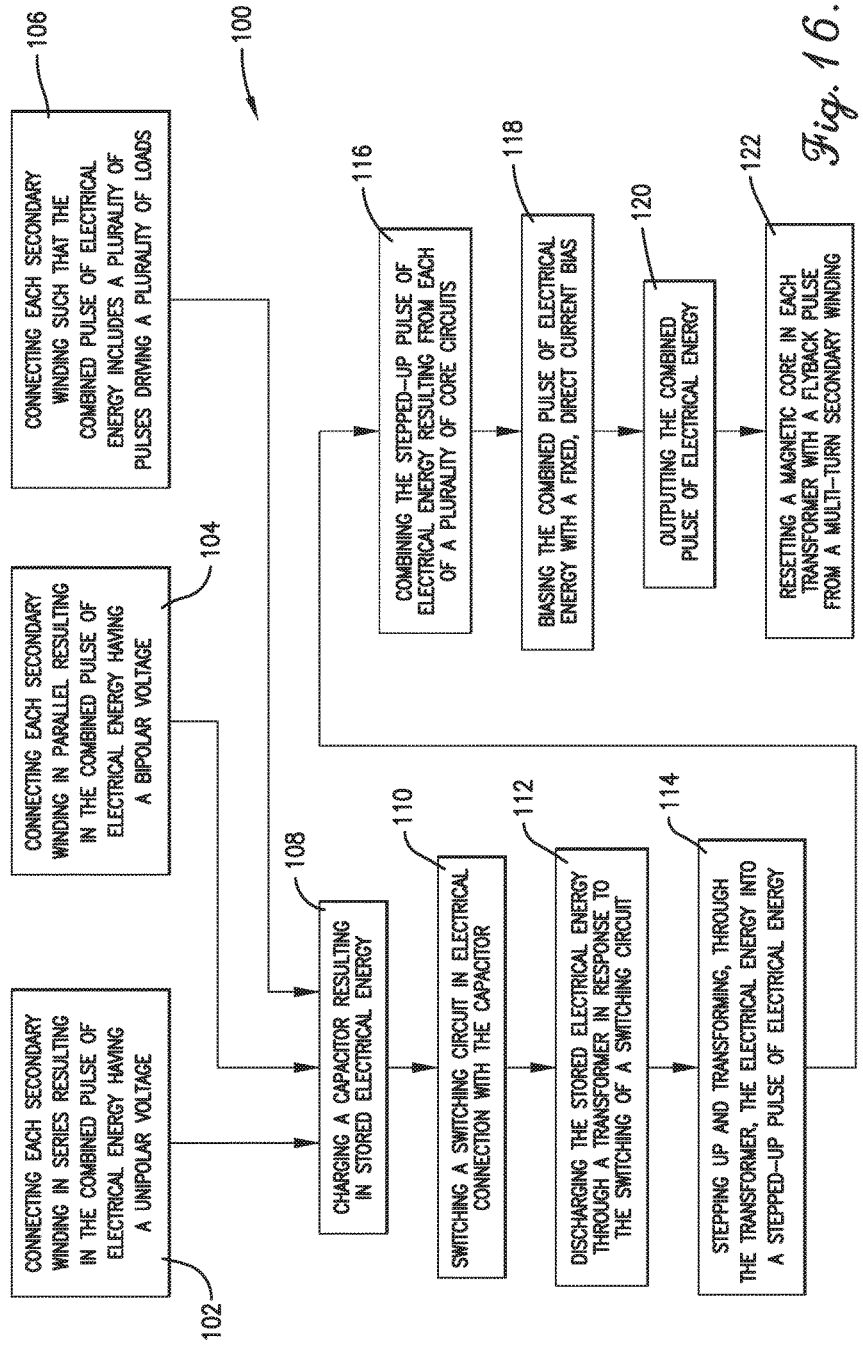
FIG. 16 is a high-level flowchart of steps in a method for generating a high voltage pulse.

Referring to FIG. 16, an embodiment is shown of a method 100 for providing a pulse transformer characteristic with a flyback transformer characteristic to generate a high voltage pulse of electrical energy. The method 100 may be a corollary to the functionality of the hybrid pulse driver 10 of FIG. 2, and may be similarly implemented using the various components of the hybrid pulse driver 10 within the above-described exemplary operating environment. The method 100 may broadly comprise the following steps, and the hybrid pulse driver 10 may function substantially as follows Depending on the desired output pulse, one of the end caps 26 may be connected to one or more of the secondary winding 52 leads. If the unipolar output pulse is desired, then the secondary windings 52 may be connected in series to provide the output pulse with the unipolar voltage, as shown in 102. If the bipolar output pulse is desired, then the secondary windings 52 may be connected in parallel to provide the output pulse with the bipolar voltage, as shown in 104. (See FIG. 15 for a graph of a bipolar output pulse). The unipolar voltage is advantageous for providing a high peak voltage with respect to ground, whereas the bipolar voltage 76 is half the peak voltage with respect to ground, but the electric potential difference is still the same between the positive and negative voltage. Since the bipolar voltage 76 is half the peak voltage of the unipolar voltage, then this considerably reduces parasitics while still providing the same electric potential difference. The bipolar voltage 76 also reduces the isolation and wire gauge necessary to handle the high voltage. If a plurality of pulses offset in time is desired, then the second end cap(s) 70 may connect the secondary windings 52, as shown in 106. For example, each stepped-up pulse may be offset in time such that the output pulse comprises a plurality of separate pulses, as opposed to adding together to create a high unipolar voltage or bipolar voltage as intended with the first 68 and second 70 end cap configurations.

The charging circuit 38 may charge the capacitor 40, as shown in 108. For example, when the switch 62 is in an off state and not receiving a sufficient voltage to switch to an on state, the direct current power supply 12 may deliver a fixed DC voltage to the charging circuit 38, and the charging circuit 38 may charge the capacitors 40 up to the voltage applied by the fixed DC voltage. In some embodiments, one charging circuit 38 will charge two capacitors 40 on the same core circuit 20.

The switching circuit 22 may switch states, triggering the capacitor 40 to discharge the stored electrical energy through the transformer 36, as shown in 110 and 112. The controller 14 or any other capable device may send a low-power input signal to the gate driver 60, and the gate driver 60 may respond by producing a high current drive input for the gate of the switch 62. In some embodiments, the gate driver 60 may be capable of driving two switches 62. Upon receiving the drive input at the gate, the switch 62 will close and short circuit the capacitors 40 to ground. Thus, the capacitors 40 may discharge directly to ground through the switch 62 and may pull a charge through the primary winding 50 of the transformer 36. For example, the capacitor 40 may discharge current through the leads from the capacitors 40, to the core housing conductive pad 44, through the feedthroughs passing through circuit board 34, to the core housing (primary winding 50) on the opposing side, around the core housing, and back through the fasteners 46.

The transformer 36 may step up and transform the voltage of the electrical energy from the primary winding 50 to the secondary winding 52 into a higher voltage pulse, as shown in 114. As depicted in FIGS. 4 and 5, if the core circuit 20 comprises opposing transformers 36 and magnetic cores 48 on opposing sides of the core circuit board, then each transformer 36 will pull current in an opposite direction. As the stored energy from the capacitors 40 are discharged through the primary winding 50 of the transformer 36, a surge current may be induced in the secondary winding 52. Each transformer 36 may step up the voltage of the charge and transform it into a pulse in the secondary winding 52. Each of the secondary windings 52 may be connected so that each pulse is added together to create a single high voltage output pulse.

Each stepped-up pulse from each core circuit 20 and/or transformer 36 may be combined in the secondary winding 52 and/or output 28, as shown in 116. The hybrid pulse driver 10 may include or function similar to an inductive adder circuit by combining and/or adding the voltage of each pulse from the secondary winding 52 of each transformer 36. The voltage of the pulse for each transformer 36 may add together in a combined output pulse, but the inductance of each secondary winding 52 may not add together.

The combined pulse of electrical energy may be biased with a fixed DC bias voltage, as shown in 118. The DC bias may be applied at the secondary winding 52, and the location for providing the DC bias may be determined by the configuration of the end caps 26 and secondary windings 52. For example, referring to FIG. 13, if the hybrid pulse driver 10 is configured to operate in bipolar mode, a capacitor may be inserted between the two secondary windings at the ground end, and the DC bias may be applied to one or both of the secondary windings at that point. Biasing the output pulse in this manner is relatively simple and does not adversely affect the output pulse waveform, such as the shape of the waveform. Furthermore, since the secondary winding 52 is completely isolated from the primary winding 50, then each secondary winding 52 can be biased with a fixed DC bias, e.g. 5V to 6 kV. For example, if the hybrid pulse driver 10 is configured with end caps 70 to output the bipolar pulse, then a DC bias of 3 kV, a DC bias of 0 (ground), and/or a DC bias of −3 kV may be applied such that the bipolar pulse is superimposed on the bias. This enables a user to use the DC bias to steer the charge created by the AC pulse from the transformers 36 and remaining after the pulse event ends and before the next pulse begins. This operation mode is not available with typical flyback transformers.

The combined pulse of electrical energy may be outputted through the output 28, as shown in 120. The output pulse may include thousands of volts, and may have the unipolar voltage, bipolar voltage, or plurality of pulses. Due to the high voltage output pulse, the hybrid pulse driver 10 may require insulated wires rated for safely transmitting thousands of volts. Furthermore, high voltage lead exit bushings 74 may be required to provide insulation between the high voltage pulse and the grounded housing 30 as the output 28 wires exit the hybrid pulse driver 10. After the combined pulse has been outputted, the flyback pulse 78 may result from inductance in the multi-turn secondary winding 52 and may reset the respective magnetic core(s) 48 associated with the respective secondary winding 52 in each core circuit 20, as shown in 122. (See FIG. 15 for a graph of a flyback pulse following a bipolar output pulse).

The method 100 may include more, fewer, or alternative actions, including those discussed elsewhere herein, and particularly those discussed above in describing the hybrid pulse driver 10. The hybrid pulse driver 10 may include more, fewer, or alternative components and/or perform more, fewer, or alternative actions, including those discussed elsewhere herein, and particularly those discussed below in describing the computer-implemented method.

Although the invention has been described with reference to the one or more embodiments illustrated in the figures, it is understood that equivalents may be employed and substitutions made herein without departing from the scope of the invention as recited in the claims.

Having thus described one or more embodiments of the invention, what is claimed as new and desired to be protected by Letters Patent includes the following:

1. A hybrid pulse driver combining a pulse transformer characteristic and a flyback transformer characteristic, the hybrid pulse driver comprising:
 a plurality of core circuits, each core circuit including—
  a transformer having a magnetic core, a single-turn primary winding, and a multi-turn secondary winding;
 a switching circuit that, when switched to an on state, results in electrical energy discharging through the transformer in each core circuit, each transformer transforming the electrical energy into a stepped-up pulse, and each transformer transmitting a flyback pulse following the stepped-up pulse, the flyback pulse resetting the magnetic core; and
 an output that transmits an output pulse, the output pulse including a sum of each stepped-up pulse.

2. The hybrid pulse driver of claim 1, wherein the single-turn primary winding includes a conductive housing that at least partially encapsulates the magnetic core.

3. The hybrid pulse driver of claim 2, wherein each core circuit further includes a conductive pad in electrical connection with the conductive housing such that electrical energy flowing through the conductive pad and conductive housing encapsulates the magnetic core.

4. The hybrid pulse driver of claim 1, wherein the hybrid pulse driver further includes a selectively removable end cap to connect the multi-turn secondary winding of each core circuit in series resulting in the output pulse having a unipolar voltage.

5. The hybrid pulse driver of claim 1, wherein the hybrid pulse driver further includes a selectively removable end cap to connect the multi-turn secondary winding of each core circuit in parallel resulting in the output pulse having a bipolar voltage.

6. The hybrid pulse driver of claim 1, wherein the hybrid pulse driver further includes a selectively removable end cap that connects the multi-turn secondary winding of each core circuit such that the output pulse includes a plurality of pulses driving a plurality of loads.

7. The hybrid pulse driver of claim 1, wherein each core circuit further includes a first set of winding supports positioned inboard of the magnetic core and that provides electrical isolation and mechanical support for wire associated with the multi-turn secondary winding, and a second set of winding supports positioned outboard of the magnetic core and that provides electrical isolation and mechanical support for wire associated with the multi-turn secondary winding.

8. The hybrid pulse driver of claim 1, wherein the output pulse is biased with a direct current bias voltage.

9. A hybrid pulse driver combining a pulse transformer characteristic and a flyback transformer characteristic, the hybrid pulse driver comprising:
 a plurality of core circuits, each core circuit having a first surface opposing a second surface, and each core circuit including— a first hybrid transformer associated with the first surface and having a first magnetic core, a first single-turn primary winding, and a first multi-turn secondary winding, and a second hybrid transformer associated with the second surface and having a second magnetic core, a second single-turn primary winding, and a second multi-turn secondary winding;

a switching circuit that triggers a first charge of electrical energy to be discharged through the first hybrid transformer and a second charge of electrical energy to be discharged through the second hybrid transformer, the first hybrid transformer stepping up and transforming the first charge into a first high voltage pulse and the second hybrid transformer stepping up and transforming the second charge into a second high voltage pulse; and an output that receives an output pulse from the first and second hybrid transformers, the output pulse including a sum of the first and second high voltage pulses of each core circuit, wherein the output pulse is followed by a flyback pulse that resets the first and second magnetic cores of each core circuit, the flyback pulse resulting from the multi-turn secondary winding.

10. The hybrid pulse driver of claim 9, wherein the first single-turn primary winding includes a first conductive housing that at least partially encapsulates the first magnetic core, and the second single-turn primary winding includes a second conductive housing that at least partially encapsulates the second magnetic core.

11. The hybrid pulse driver of claim 9, wherein the first multi-turn secondary winding is energized with current flowing in a first direction, and the second multi-turn secondary winding is energy with current flowing in a second direction different from the first direction.

12. The hybrid pulse driver of claim 9, wherein the hybrid pulse driver further includes a selectively removable end cap to connect the first and second multi-turn secondary windings of each core circuit in series resulting in the output pulse having a unipolar voltage.

13. The hybrid pulse driver of claim 9, wherein the hybrid pulse driver further includes a selectively removable end cap to connect the first and second multi-turn secondary windings of each core circuit in parallel resulting in the output pulse having a bipolar voltage.

14. The hybrid pulse driver of claim 9, wherein the hybrid pulse driver further includes a selectively removable end cap that connects the first and second multi-turn secondary windings of each core circuit such that the output pulse includes a plurality of pulses driving a plurality of loads.

15. The hybrid pulse driver of claim 9, wherein each core circuit further includes a first set of apertures positioned inboard of the first and second magnetic cores and that provide electrical isolation and mechanical support for a first portion of wire associated with the first and second multi-turn secondary windings, and a second set of apertures positioned outboard of the first and second magnetic cores and that provide electrical isolation and mechanical support for a second portion of wire associated with the first and second multi-turn secondary windings.

16. The hybrid pulse driver of claim 9, wherein the output pulse is biased with a direct current bias voltage.

17. A method for providing a pulse transformer characteristic with a flyback transformer characteristic, the method comprising:

charging a capacitor resulting in stored electrical energy, each capacitor being associated with one of a plurality of core circuits, each core circuit further comprising a transformer, the transformer including a single-turn primary winding, a magnetic core, and a multi-turn secondary winding;

discharging the stored electrical energy through the transformer;

stepping up and transforming, through the transformer, the electrical energy into a stepped-up pulse of electrical energy;

combining the stepped-up pulse of electrical energy resulting from each of the plurality of core circuits;

outputting the combined stepped-up pulse of electrical energy;

resetting the magnetic core in each transformer with a flyback pulse from the multi-turn secondary winding.

18. The method of claim 17, wherein the method further includes biasing the combined stepped-up pulse of electrical energy with a fixed, direct current bias.

19. The method of claim 17, wherein the method further includes connecting each secondary winding in series resulting in the combined stepped-up pulse of electrical energy having a unipolar voltage.

20. The method of claim 17, wherein the method further includes connecting each secondary winding in parallel resulting in the combined stepped-up pulse of electrical energy having a bipolar voltage.

* * * * *